(12) United States Patent
Nicollini et al.

(10) Patent No.: US 9,554,209 B2
(45) Date of Patent: Jan. 24, 2017

(54) MICROPHONE PREAMPLIFIER CIRCUIT

(75) Inventors: Germano Nicollini, Piacenza (IT); Andrea Barbieri, Lodi (IT)

(73) Assignee: OPTIS CIRCUIT TECHNOLOGY, LLC, Plano, TX (US)

( * ) Notice: Subject to any disclaimer, the term of this patent is extended or adjusted under 35 U.S.C. 154(b) by 360 days.

(21) Appl. No.: 14/129,320

(22) PCT Filed: Jul. 13, 2012

(86) PCT No.: PCT/EP2012/063826
§ 371 (c)(1),
(2), (4) Date: Feb. 10, 2014

(87) PCT Pub. No.: WO2013/014009
PCT Pub. Date: Jan. 31, 2013

(65) Prior Publication Data
US 2014/0153746 A1    Jun. 5, 2014

Related U.S. Application Data

(60) Provisional application No. 61/523,471, filed on Aug. 15, 2011.

(30) Foreign Application Priority Data

Jul. 26, 2011   (EP) ..................... 11175387

(51) Int. Cl.
*H04R 3/00* (2006.01)
*H03F 3/45* (2006.01)
(Continued)

(52) U.S. Cl.
CPC ............... *H04R 3/00* (2013.01); *H03F 3/005* (2013.01); *H03F 3/187* (2013.01);
(Continued)

(58) Field of Classification Search
CPC .... H04R 3/00; H03F 3/45475; H03F 3/45928; H03F 3/45937; H03F 3/45959; H03F 3/005; H03F 3/187; H03F 2203/45514; H03F 2203/45528; H03F 2203/45512
(Continued)

(56) References Cited

U.S. PATENT DOCUMENTS 6,556,072 B1    4/2003  Nicollini et al.
2008/0226100 A1*  9/2008  Oddoart ................ H03F 1/26
                                                    381/120
(Continued)

FOREIGN PATENT DOCUMENTS

EP    0 375 017 A2    6/1990
EP    2 133 993 A1    12/2009

OTHER PUBLICATIONS

International Search Report issued in corresponding International application No. PCT/EP2012/063826, date of mailing Oct. 17, 2012.

*Primary Examiner* — Curtis Kuntz
*Assistant Examiner* — Qin Zhu
(74) *Attorney, Agent, or Firm* — The Danamraj Law Group, P.C.; Thomas L. Crisman; Kenneth A. McClure

(57) ABSTRACT

A microphone preamplifier circuit is adapted to be connected to a microphone circuit, the microphone circuit including a microphone and at least one output node. The microphone preamplifier circuit includes a preamplifier including: an operational amplifier having at least one input and at least one output; at least one input DC decoupling capacitor connected to the at least one input of the operational amplifier; at least one feedback capacitor connected between the input and the output of the operational amplifier in order to set together with the at least one input DC decoupling capacitor a gain value of the preamplifier circuit; and first and second feed nodes adapted to be fed by first and
(Continued)

second bias voltages respectively. The preamplifier further includes at least one switched capacitor adapted to be selectively and alternatively connected in response to a clock signal: between the at least one input and the at least one output of the operational amplifier; and between the first and second feed nodes. The microphone preamplifier circuit further includes an anti-aliasing filter having: (i) at least one output terminal connected to the at least one input DC decoupling capacitor and (ii) at least one input terminal adapted to be connected to the at least one output node of the microphone circuit.

16 Claims, 4 Drawing Sheets

(51) Int. Cl.
*H03F 3/00* (2006.01)
*H03F 3/187* (2006.01)

(52) U.S. Cl.
CPC ..... *H03F 3/45475* (2013.01); *H03F 3/45928* (2013.01); *H03F 3/45937* (2013.01); *H03F 3/45959* (2013.01); *H03F 2203/45512* (2013.01); *H03F 2203/45514* (2013.01); *H03F 2203/45528* (2013.01)

(58) Field of Classification Search
USPC ...... 381/28, 74, 77, 84, 11, 120; 330/7, 252, 330/254, 260, 261, 177, 157
See application file for complete search history.

(56) References Cited

U.S. PATENT DOCUMENTS

2009/0316935 A1* 12/2009 Furst .................... H03F 1/3211
381/111
2010/0156535 A1* 6/2010 Nicollini .............. H03G 1/0088
330/254
2011/0140945 A1 6/2011 Sundblad

* cited by examiner

MICROPHONE PREAMPLIFIER CIRCUIT

TECHNICAL FIELD

The present disclosure relates to a microphone preamplifier circuit.

BACKGROUND ART

One of the main aspects to take into account in the development of an electronic device, especially mobile devices, is the area occupation. In the field of mobile devices, such as mobile phones, the reduction of the area occupation on the Printed Circuit Board (PCB) is a key point in order to create phones with much more functionalities without altering their dimensions. The focus, during the years, has been to integrate inside a chip, where possible, all those passive components such as resistors, capacitors and inductors which represent the main limit for the area reduction. Inside old generation phones, such passive components were SMD (Surface Mount Devices) mounted directly on the main board. Later on, thanks to improvement in the technology, these devices were placed inside the chip package, a methodology known as PDI (Passive Device Integration), and in some cases directly integrated inside the chip. However, when it comes to the microphone preamplifying path the implementation of this approach has not been possible due to the huge capacitance value of the decoupling capacitors needed between the microphone and the preamplifier.

FIGS. 1 and 2 show two known ways, single-ended and differential, respectively, to bias and connect the microphone circuit $MC_S$, $MC_D$ to a preamplifier $PA_S$, $PA_D$ using an RC network. The microphone circuit $MC_S$, $MC_D$ comprises a microphone 3 and a biasing circuit $R_{MB1}$, $R_{MB2}$, $R_{MB3}$, C1, C2, fed by a bias voltage $V_{BIAS}$.

The DC bias voltage of the signal coming from the microphone circuit $MC_S$, $MC_D$ at the output nodes $M_O$, $M_O'$ of the microphone circuit $MC_S$, $MC_D$ will depend exclusively by the biasing circuit $R_{MB1}$, $R_{MB2}$, $R_{MB3}$, C1, C2 and is usually different from the DC bias input voltage of the preamplifier $PA_S$, $PA_D$. The level shifting between the microphone 3 and the preamplifier $PA_S$, $PA_D$ DC biasing voltages is commonly obtained using a decoupling capacitor $C_{DEC}$ that produces, with the preamplifier $PA_S$, $PA_D$ input resistance, a first order high-pass filter whose corner frequency is generally lower than 20 Hz in order to avoid in-band audio signal perturbation.

More detailed representations of the differential preamplifier $PA_D$ are shown in FIG. 3 (inverting configuration) and FIG. 4 (non-inverting configuration).

In the inverting case, due to noise generation, input resistors $R_{1A}$ and $R_{1B}$ cannot have high resistance values (typically from 10 kOhm to 50 kOhm), whereas in the non-inverting solution resistors $R_{3A}$ and $R_{3B}$ are used only to bias the amplifiers OA inputs at a common mode voltage $V_{CM}$ midway between ground and the supply voltage. Accordingly, resistors $R_{3A}$ and $R_{3B}$ don't contribute in noise generation and can be made with larger resistance values with respect to the inverting case (however, not more than some hundreds of kOhms due to area occupation). In both cases, decoupling capacitors $C_{DEC}$ of more than 100 nF are needed and such large capacitance values would be difficult to integrate in a chip. In fact, with actual technologies on chip integration of a capacitor having such large capacitance value would require an area greater than 20 mm² and this fact made the integrating approach practically unusable. US 2002/0125949 discloses the above problem of the waste of area due to the integration in the chip of the decoupling capacitor $C_{DEC}$, confirming that the integration of the decoupling capacitors $C_{DEC}$ is practicable only for relatively reduced capacitance values. Also U.S. Pat. No. 7,899,196 addresses the problem of the area occupied by the preamplifier and discloses a digital microphone comprising a microphone element, a preamplifier with a high pass filter function an anti-aliasing filter and an analog to digital converter.

Moreover, unfortunately, even with the PDI methodology the decoupling capacitors $C_{DEC}$ can't be realized because of their high capacitance value and the fact that none of their terminals are connected to a fixed potential. This is the reason why all the existing known solutions use SMD capacitors. Since a preamplifier usually has several inputs (voice microphone, mono and stereo audio microphone, mono and stereo line-in, etc.) and each one could be differential, it is clear that on a mobile phone's PCB there are many SMD decoupling capacitors $C_{DEC}$.

The presence of one or more SMD decoupling capacitors is clearly a bottle neck for the area reduction strategy, and there is a strong felt need of trying to find a solution to this problem, till now without success. The same above described problem holds for other consumer devices different from mobile phones, such as portable MP3 players, digital photo cameras, digital audio recorders, video cameras, and in general in devices with audio communication and/or recording and/or processing capabilities.

Moreover, with reference to FIGS. 3 and 4, a further problem of the prior art microphones preamplifiers, especially if they are intended to be embedded in mobile devices, is their power consumption. A significant contribution to such power consumption is given by the input and feedback resistors provided for setting the gain of the microphone preamplifier.

EP 2 133 993 A1, EP 0 375 017 A2 and U.S. Pat. No. 6,656,072 B1 disclose filters and/or gain circuits. However such documents neither refer to microphone systems nor address the above disclosed problem concerning the decoupling capacitor.

SUMMARY OF THE INVENTION

In view of the above described limitations of the prior art microphone preamplifier circuits, it is an object of the present invention to provide a microphone preamplifier circuit which is adapted to solve the above indicated problems concerning: the impossibility of reducing the PCB area occupation below a desired value due to the presence of one or more decoupling capacitors that cannot be integrated on a chip and the consumption of the preamplifier.

The above object is reached by a microphone preamplifier circuit adapted to be connected to a microphone circuit, the microphone circuit comprising a microphone and at least one output node. The microphone preamplifier circuit comprises a preamplifier comprising:
  at least one input node adapted to be connected to said output node;
  an operational amplifier comprising at least one input and at least one output;
  at least one input DC decoupling capacitor connected between said input node of the operational amplifier and said input.

The preamplifier comprises at least one feedback capacitor connected between the input and the output of the operational amplifier in order to set together with said input DC decoupling capacitor a gain value of the preamplifier circuit. The preamplifier comprises a first and a second feed node adapted to be fed by a first and a second bias voltage respectively. The preamplifier further comprises at least one switched capacitor adapted to be selectively and alternatively connected under the control of a clock signal:

between said input and said output of the operational amplifier; and between said first and said second node.

The preamplifier further comprises an anti-aliasing filter having an output terminal connected to said input node and an input terminal connected/connectable to said output node of the microphone circuit.

In the above circuit, since the high pass filtering function is performed by the operational amplifier, the feedback capacitor and the switched capacitor, the DC decoupling capacitor, apart from contributing to the establishment of the gain of the preamplifier, only performs a DC decoupling function between the microphone circuit's output and the operational amplifier's and does not need to have a high value, as in the above described prior art circuits, in order to implement a high pass filtering function.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures identical or similar elements will be indicated with the same reference numbers/symbols.

Figure 1:
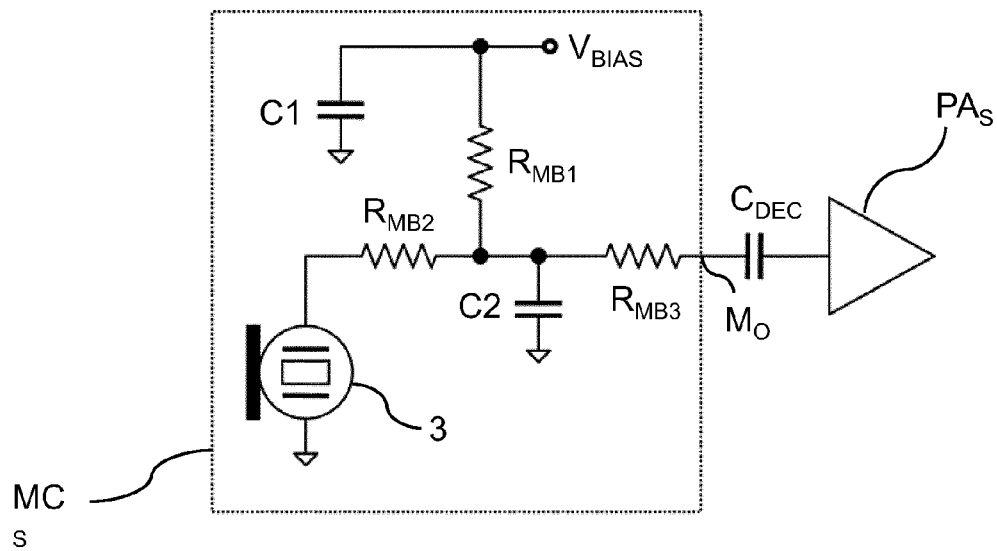
FIG. 1 shows a schematic view of a first example of prior art microphone system comprising a microphone circuit and a preamplifier.
Figure 2:
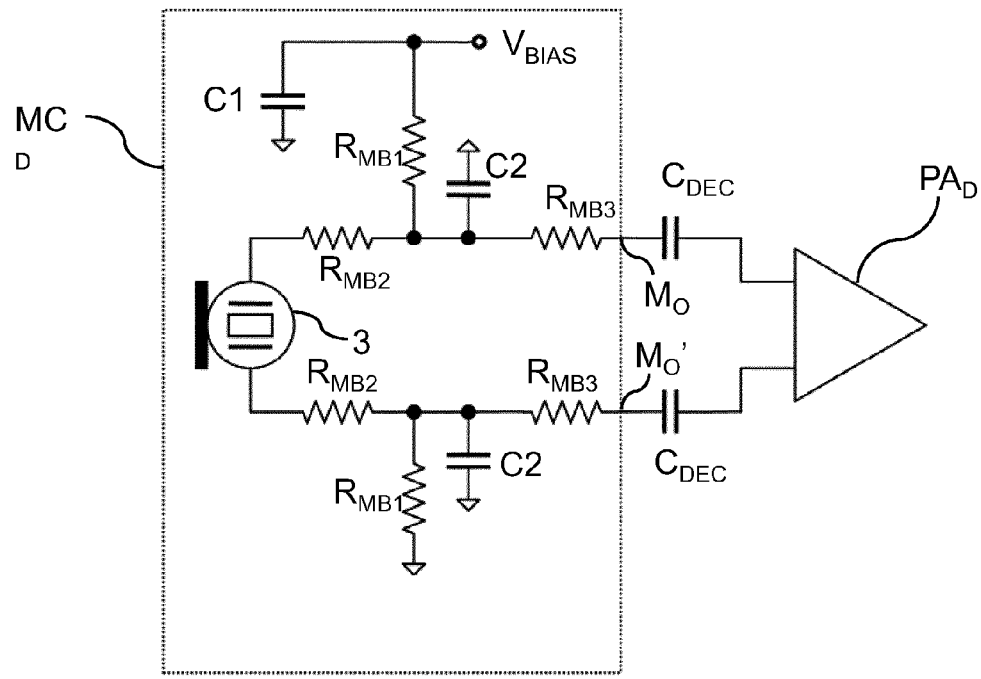
FIG. 2 shows a schematic view of a second example of prior art microphone system comprising a microphone circuit and a preamplifier.
Figure 3:
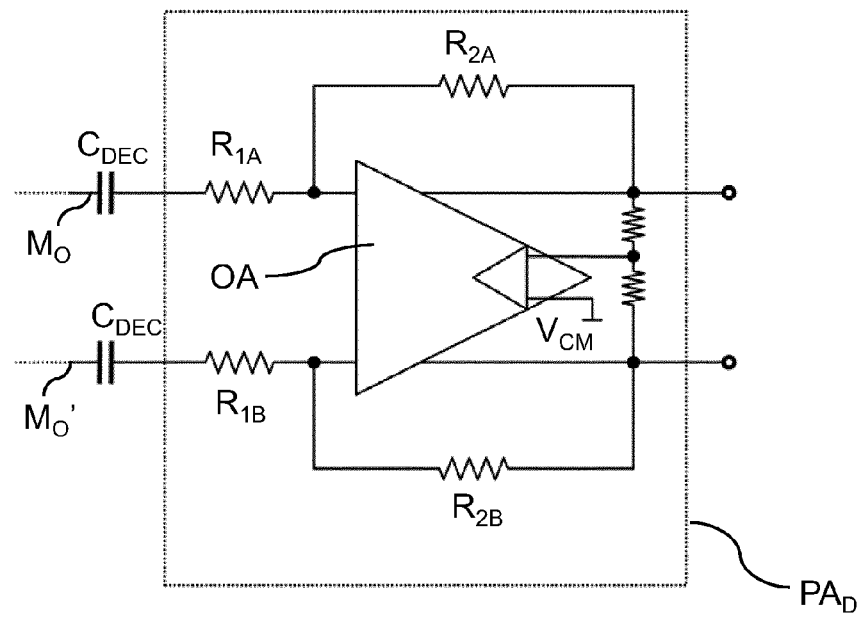
FIG. 3 shows a schematic view of a first example of a known preamplifier for the microphone system of FIG. 2.
Figure 4:
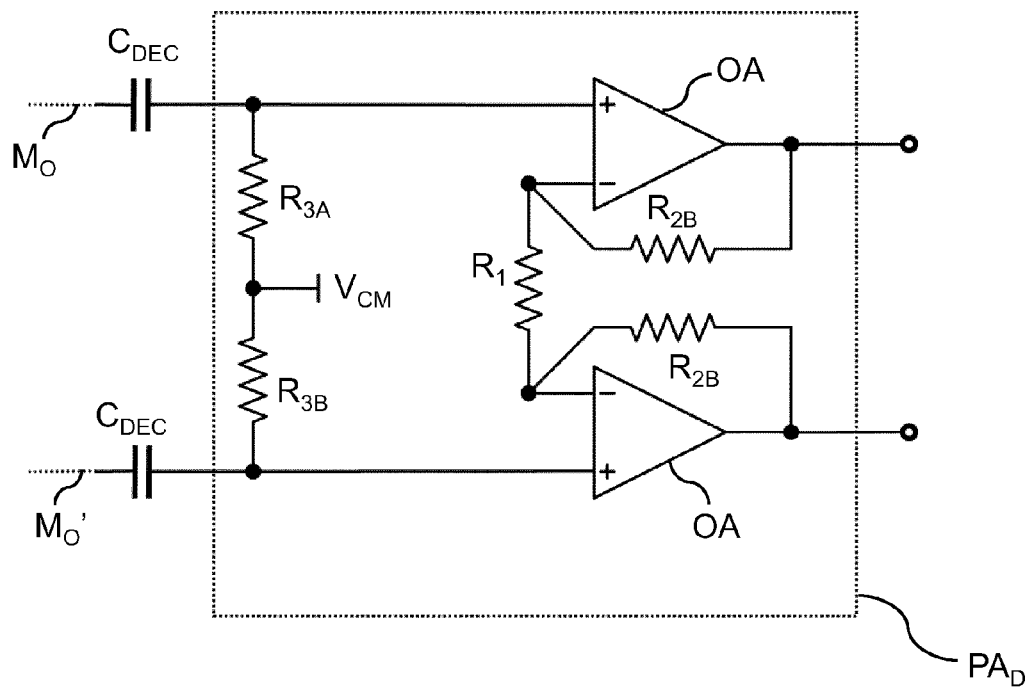
FIG. 4 shows a schematic view of a second example of known preamplifier for the microphone system of FIG. 2.
Figure 5:
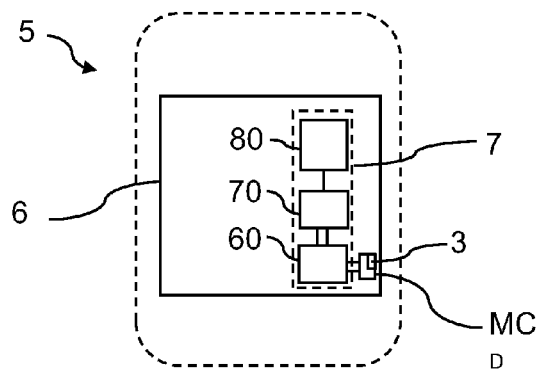
FIG. 5 shows a very schematic view of a device provided with audio recording and/or communication and/or processing capabilities.

FIG. 5 shows a very schematic view of an embodiment of mobile terminal 5, such as for example a mobile phone 5, comprising a microphone circuit $MC_D$. According to an embodiment, and without for this reason introducing any limitation, the microphone circuit $MC_D$ may be similar to the differential microphone circuit $MC_D$ represented in FIG. 2. The microphone circuit $MC_D$ comprises a microphone 3, a microphone's biasing network and two differential output nodes $M_O$, $M_O'$ (represented in FIG. 6). According to an embodiment, the microphone's biasing network may be identical or similar to the known biasing network of FIG. 2.

The mobile phone 5 comprises a circuit board 6 comprising a chip 7 comprising an integrated microphone preamplifier circuit 60. According to the embodiment shown, the circuit board 6 further comprises an analog to digital converter 70 and a digital audio processor 80. In the example of FIG. 5, the preamplifier circuit 60, the digital converter 70 and the digital audio processor 80 are integrated on the same chip 7.

As the general structure and the operation of a mobile terminal, such for example a mobile phone, are well known to a man skilled in the field, for sake of conciseness they will not be detailed further in the following part of the description. On the contrary, the following part of the description will be mainly focused on the microphone preamplifier circuit 60. It is important to remark that such microphone preamplifier circuit 60 can be also employed in systems and/or devices different from a mobile terminal 5, for example in general in devices having audio communication and/or recording and/or processing capabilities such as, digital audio recorders, MP3 players, photo-cameras etc.

Figure 6:
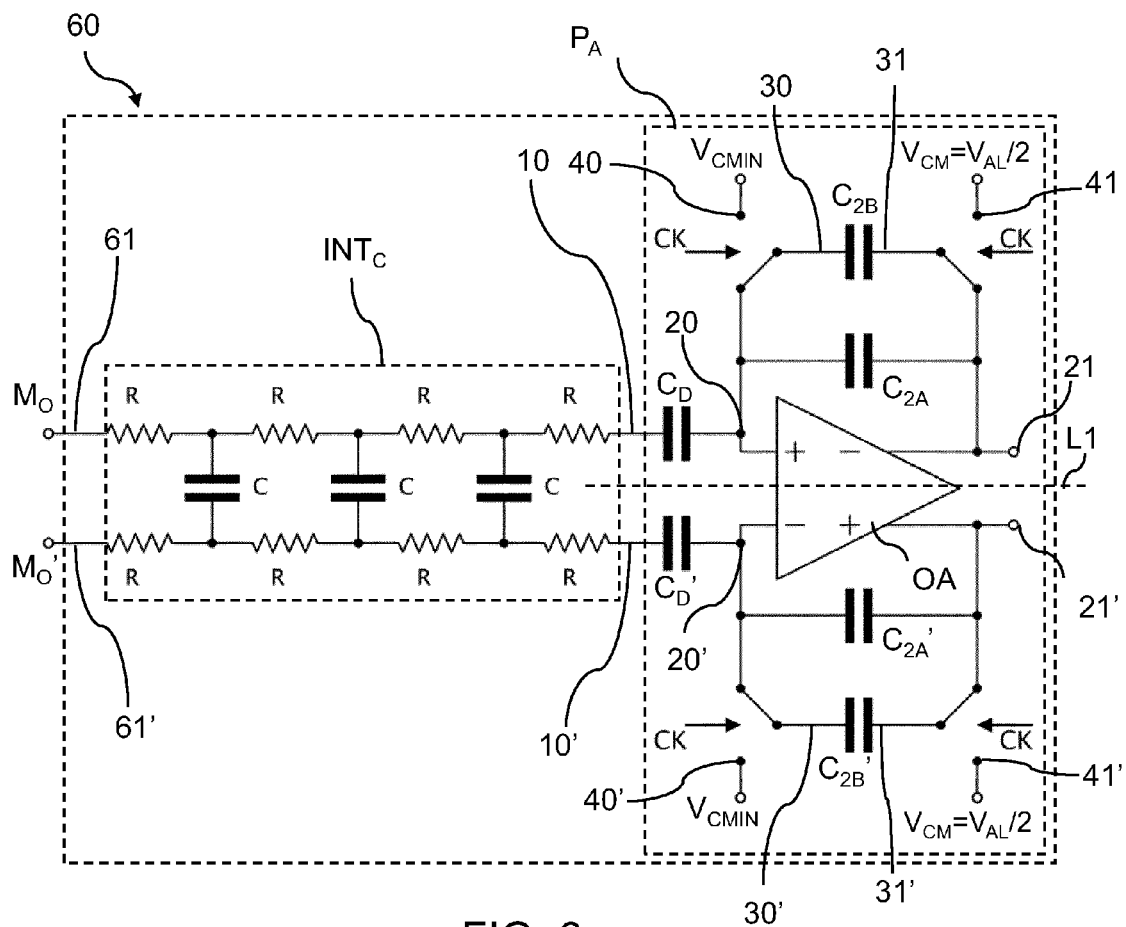
FIG. 6 shows an embodiment of a microphone preamplifier circuit.

FIG. 6 shows an embodiment of microphone preamplifier circuit 60 comprising a preamplifier $P_A$, the microphone preamplifier circuit 60 being adapted to be connected to the microphone 3, or more precisely to the microphone circuit $MC_D$.

According to the embodiment shown, the preamplifier $P_A$ is a differential preamplifier having two input nodes 10, 10' and an operational amplifier OA. The input nodes 10, 10' are adapted to be connected to the output nodes $M_O$, $M_O'$ of the microphone circuit $MC_D$. In the particular example shown in FIG. 6, the operational amplifier OA is arranged in said microphone preamplifier circuit 60 in order to operate in an inverting configuration.

Since the structure of the microphone preamplifier circuit 60 and the preamplifier $P_A$ in the embodiment shown is totally symmetrical, in the present description mostly the upper branch of the preamplifier $P_A$ will be detailed, i.e. the branch above the ideal line L1. Moreover, it should be clear that even if in the present description a microphone preamplifier circuit 60 adapted to be connected to a differential microphone circuit $M_{CD}$ will be disclosed, the teachings of the present description can be easily extended by a man skilled in the field to the case in which the microphone preamplifier circuit is adapted to be connected to a single-ended microphone circuit.

With reference to FIG. 6, the preamplifier $P_A$ comprises an operational amplifier OA comprising at least one input 20,20' and at least one output 21, 21'. Moreover, the preamplifier $P_A$ comprises at least one input DC decoupling capacitor $C_D$, $C_{D'}$ connected between the input node 10, 10' of the preamplifier $P_A$ and the input 20,20' of the operational amplifier OA.

The preamplifier $P_A$ further comprises at least one feedback capacitor $C_{2A}$, $C_{2A}'$ connected between the input 20,20' and the output 21, 21' of the operational amplifier in order to set together with said input DC decoupling capacitor $C_D$, $C_{D'}$ a gain value G of the preamplifier circuit 60. Such gain value G is given by:

$$G = -\frac{C_D}{C_{2A}}.$$

As shown in FIG. 6, the preamplifier $P_A$ comprises at least one first 40, 40' and at least one second feed node 41, 41' adapted to be fed by a first $V_{CMIN}$ and a second $V_{CM}$ bias voltage respectively.

The preamplifier $P_A$ further comprises at least one switched capacitor $C_{2B}$, $C_{2B}'$ adapted to be selectively and alternatively connected under the control of a clock signal CK:
- between the input 20, 20' and the output 21, 21' of the preamplifier $P_A$, i.e. in parallel to the feedback capacitor $C_{2A}$, $C_{2A}'$; and
- between the above mentioned first 40, 40' and second 41, 41' feed nodes.

According to an embodiment, the switched capacitor $C_{2B}$, $C_{2B}'$ comprises:
- a first plate (in FIG. 6 on the left side of capacitor $C_{2B}$, $C_{2B}'$) adapted to be selectively and alternatively connected to the input 20, 20' and the first feed node 40,40'; and
- a second plate (in FIG. 6 on the right side of capacitor $C_{2B}$, $C_{2B}'$) adapted to be selectively and alternatively connected to the output 21, 21' and the second feed node 41, 41'.

According to the above embodiment the second feed node 41,41' is configured to be fed with the common mode voltage $V_{CM}$ of the operational amplifier OA and the first feed node 40, 40' is configured to be fed with a further voltage $V_{CMIN}$ appropriate for input operation of the operational amplifier OA. For example, if the operational amplifier OA is fed with a supply voltage $V_{AL}$:
- the common mode voltage $V_{CM}$ is half of said supply voltage $V_{AL}$;
- the above mentioned further voltage $V_{CMIN}$ is lower than said common mode voltage $V_{CM}$ if the operational amplifier OA has P-type input and higher than said common voltage $V_{CM}$ if the operational amplifier OA has N-type input.

For example, without for this reason introducing any limitation, if $V_{AL}$=1.5 Volts, $V_{CM}$=0.75 Volts, and $V_{CMIN}$=0.5 Volts if the operational amplifier OA has a P-type input or $V_{CMIN}$=1.0 Volts if the operational amplifier OA has N-type input.

Figure 7:
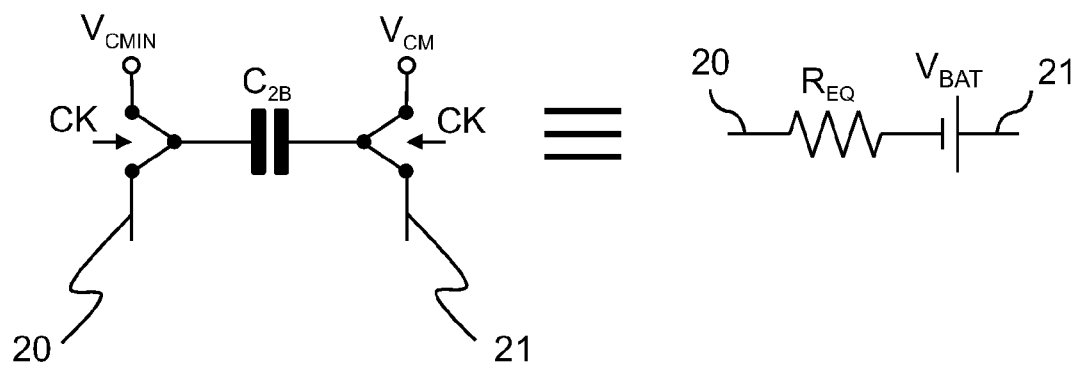
FIG. 7 shows a part of the circuit of FIG. 6 and the equivalent circuit thereof.

From the above description it is therefore clear that the switched capacitor $C_{2B}$, $C_{2B}'$ is a capacitor provided to bias the input 20,20' of the operational amplifier OA to the further voltage $V_{CMIN}$, since as shown in FIG. 7 it can be modeled with a resistor having an equivalent resistance $R_{EQ}$=1/$(f_{CK} \cdot C_{2B})$ in series with a battery providing a voltage $V_{BAT}$=$V_{CM}$−$V_{CMIN}$.

From FIG. 7 it is therefore clear that the switched capacitor $C_{2B}$, $C_{2B}'$ is also adapted to discharge the feedback capacitor $C_{2A}$, $C_{2A}'$ (FIG. 6) at a given frequency than can be set to be relatively very low by selecting appropriate values for the frequency $f_{CK}$ of the clock signal CK and the appropriate capacitance values of the feedback $C_{2A}$, $C_{2A}'$ and the switched $C_{2B}$, $C_{2B}'$ capacitors. By selecting the above indicated appropriated values, the preamplifier PA can be designed to be adapted to implement a high pass filtering function which, having a relatively very low high pass cut-off frequency, does not interfere with audio signals of interest for the operation of the microphone 3. According to an embodiment, said high pass filtering function has a high pass cut-off frequency of 6 Hz or about 6 Hz, for example comprised between 4 Hz and 8 Hz.

The time constant of the above mentioned high pass filtering is given by:

$$\tau = \frac{1}{f_{CK}} \cdot \frac{C_{2A}}{C_{2B}}. \quad (1)$$

In view of the above, the high pass cut-off frequency can be made as to have a value of about 6 Hz if for example the clock frequency $f_{CK}$ has a value of the order of magnitude of 100 kHz, for example $f_{CK}$=100 kHz and the switched capacitor $C_{2B}$, $C_{2B}'$ has a capacitance value significantly lower than a capacitance value of the feedback capacitor $C_{2A}$, $C_{2A}'$. For example, the switched capacitor $C_{2B}$, $C_{2B}'$ has a capacitance value of about three magnitude orders lower the capacitance value of said feedback capacitor $C_{2A}$, $C_{2A}'$. In a practical embodiment, a high pass cut-off frequency of about 6 Hz can be for example obtained if $f_{CK}$=100 KHz, $C_{2A}$=100 pF, $C_{2A}$=1/30 pF.

The above values for the clock frequency $f_{CK}$ and the cutoff frequency represent a good compromise between area occupation and audio performance and represent a preferred choice, but it should be clear that a broad range of values is possible for both cut-off frequency and clock frequency. For example, paying in area the cutoff frequency can be much lower than 6 Hz (e.g. 0.6 Hz), while paying in performance it can be much higher than 6 Hz (e.g. 60 Hz).

It is clear that the above condition (1) fixes the limit for the minimum value of the capacitor $C_{2A}$ and in turn of $C_{2B}$. In any case it is clear from the example above that such values can be easily integrated without wasting a significant amount of silicon area.

Moreover, it is to be noticed that since the high pass filtering function is performed by the operational amplifier OA, the feedback capacitor $C_{2A}$, $C_{2A}'$ and the switched capacitor $C_{2B}$, $C_{2B}'$, the DC decoupling capacitor $C_D$, $C_D'$, apart from contributing to the establishment of the gain G, only performs a DC decoupling function between the microphone circuit's output and the operational amplifier's and does not need to have a high value, as in the above described prior art circuits, in order to implement a high pass filtering function. For example, the DC decoupling capacitor $C_D$, $C_D'$ can have a value of about 100 pF and therefore it can be easily integrated without wasting a significant amount of silicon area.

Moreover, a microphone preamplifier circuit 60 as described above has the additional advantage of having a relatively reduced power consumption, due to the fact that no resistors are required for biasing and setting the gain of the preamplifier, since no physical feedback and biasing resistors are directly connected to the input 20,20' of the operational amplifier.

As shown in FIG. 6, according to an embodiment, the microphone preamplifier circuit 60 comprises an anti-aliasing filter $INT_C$ at the input of the preamplifier $P_A$ having an output terminal connected to the input node 10, 10' and an input terminal 61, 61' connected/connectable to the output node $M_O$, $M_O'$ of the microphone circuit $M_{CD}$. The anti-aliasing filter $INT_C$ advantageously prevents the production of undesired replicas in the output signal of the preamplifier $P_A$ due to the presence of the switched capacitor $C_{2B}$, $C_{2B}'$.

According to an embodiment, the anti-aliasing filter $INT_C$ is a passive filter comprising a plurality of RC ladder cells (in the differential embodiment, otherwise a plurality of RC serial cells in the single-ended embodiment). In the particular example shown the anti-aliasing filter $INT_C$ comprises four RC ladder cells.

Figure 8:
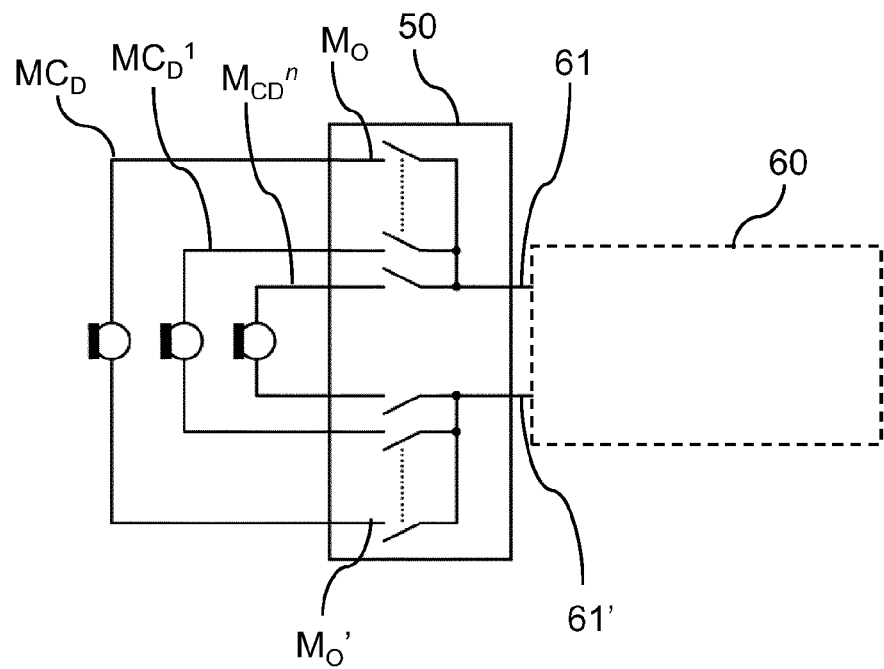
FIG. 8 shows an embodiment of a microphone system comprising the microphone preamplifier circuit of FIG. 6.

As is clear from the above description, the above described microphone preamplifier circuit 60 has the advantage of requiring one or more decoupling capacitors $C_D$, $C_D'$ having a relatively reduced capacitance value such that said capacitors can be integrated in the preamplifier's $P_A$ chip. The advantage in terms of area occupation is even greater when the preamplifier $P_A$ is shared between a plurality of n sources, such as for example n microphone circuits $M_{CD}$, $M_{CD}^1$, $M_{CD}^n$. In this case, as shown in FIG. 8, it is possible to place, or better to integrate, a multiplexer 50 (for example, realized with CMOS transfer gates) just before the decoupling capacitor $C_D, C_D'$ in order to allow the selective connection among the different n sources and the preamplifier $P_A$. In this case, only two relatively small decoupling capacitors $C_D$ (if the architecture of the preamplifier is differential) are required instead of 2n external SMD capacitors, obtaining a large reduction in the area/space occupation.

Naturally, in order to satisfy contingent and specific requirements, a person skilled in the art may apply to the above-described microphone preamplifier circuits many modifications and variations, all of which, however, are included within the scope of protection of the invention as defined by the following claims.

The invention claimed is:

1. Microphone preamplifier circuit adapted to be connected to a microphone circuit, said microphone circuit comprising a microphone and at least one output node, said microphone preamplifier circuit comprising a preamplifier comprising:
    an operational amplifier comprising at least one input and at least one output;
    at least one input DC decoupling capacitor connected to said at least one input of said operational amplifier;
    at least one feedback capacitor connected between said at least one input and said at least one output of said operational amplifier in order to set together with said at least one input DC decoupling capacitor a gain value of said microphone preamplifier circuit;
    first and second feed nodes adapted to be fed by first and second bias voltages respectively;
    wherein said preamplifier further comprises at least one switched capacitor adapted to be selectively and alternatively connected in response to a clock signal:
    between said at least one input and said at least one output of said operational amplifier; and
    between said first and second feed nodes;
    wherein said microphone preamplifier circuit further comprises an anti-aliasing filter comprising: (i) at least one output terminal connected to said at least one input DC decoupling capacitor and (ii) at least one input terminal adapted to be connected to said at least one output node of said microphone circuit, and wherein said preamplifier and said anti-aliasing filter are integrated in a same chip.

2. Microphone preamplifier circuit according to claim 1, wherein said at least one switched capacitor comprises:
    a first plate adapted to be selectively connected to said at least one input of said operational amplifier and said first feed node;
    a second plate adapted to be selectively connected to said at least one output of said operational amplifier and said second feed node;
    and wherein said second feed node is configured to be fed with a common mode voltage of said operational amplifier and said first feed node is configured to be fed with a further voltage appropriate for input operation of said operational amplifier.

3. Microphone preamplifier circuit according to claim 2, wherein said operational amplifier is fed with a supply voltage and wherein:
    said common mode voltage is half of said supply voltage; and
    said further voltage is lower than said common mode voltage if said operational amplifier has a P-type input and higher than said common mode voltage if said operational amplifier has a N-type input.

4. Microphone preamplifier circuit according to claim 1, wherein said clock signal has a frequency such that said at least one switched capacitor is adapted to discharge said at least one feedback capacitor at a frequency so that said preamplifier is adapted to implement a high pass filtering function which does not interfere with audio signals of interest for operation of said microphone.

5. Microphone preamplifier circuit according to claim 4, wherein said high pass filtering function has a high pass cut-off frequency of 6Hz.

6. Microphone preamplifier circuit according to claim 4, wherein said clock signal has a frequency of 100 kHz.

7. Microphone preamplifier circuit according to claim 1, wherein said at least one switched capacitor has a capacitance value lower than a capacitance value of said at least one feedback capacitor.

8. Microphone preamplifier circuit according to claim 7, wherein said at least one switched capacitor has a capacitance value of three magnitude orders lower than said capacitance value of said at least one feedback capacitor.

9. Microphone preamplifier circuit according to claim 1, wherein said operational amplifier is a differential amplifier, and said preamplifier has a symmetrical circuital structure including two input DC decoupling capacitors, two feedback capacitors and two switched capacitors.

10. Microphone preamplifier circuit according to claim 1, wherein said operational amplifier is arranged in said microphone preamplifier circuit in order to operate in an inverting configuration.

11. Microphone preamplifier circuit according to claim 1, wherein said anti-aliasing filter comprises a plurality of RC ladder, or serial, cells.

12. Microphone preamplifier circuit according to claim 1, further comprising a multiplexer adapted to selectively connect said microphone preamplifier circuit to one of a plurality of microphone circuits.

13. Microphone preamplifier circuit according to claim 12, wherein said multiplexer, said anti-aliasing filter and said preamplifier are integrated in said same chip.

14. Microphone system comprising said microphone circuit and said microphone preamplifier circuit according to claim 1.

15. Device having at least one of audio processing, recording and communication capabilities, said device comprising said microphone system according to claim 14.

16. Device comprising:
    a microphone;
    a microphone circuit connected to said microphone and having at least one output node; and
    a microphone preamplifier circuit connected to said at least one output node of said microphone circuit and comprising:
    an operational amplifier comprising at least one input and at least one output;
    at least one input DC decoupling capacitor connected to said at least one input of said operational amplifier;
    at least one feedback capacitor connected between said at least one input and said at least one output of said operational amplifier;
    first and second feed nodes fed by first and second bias voltages respectively;
    at least one switched capacitor selectively and alternatively connected in response to a clock signal between:

(i) said at least one input and said at least one output of said operational amplifier, and (ii) said first and second feed nodes; and an anti-aliasing filter comprising: (i) at least one output terminal connected to said at least one input DC decoupling capacitor and (ii) at least one input terminal connected to said at least one output node of said microphone circuit, and wherein said microphone pre-amplifier circuit is integrated in a single chip.

* * * * *